United States Patent [19]

Aoki

[11] Patent Number: 4,733,284

[45] Date of Patent: Mar. 22, 1988

[54] SEMICONDUCTOR DEVICES AND LAMINATES INCLUDING PHOSPHORUS DOPED TRANSPARENT CONDUCTIVE FILM

[75] Inventor: Shigeo Aoki, Habikono, Japan

[73] Assignee: Hosiden Electronics Co., Ltd., Osaka, Japan

[21] Appl. No.: 911,695

[22] Filed: Sep. 26, 1986

[30] Foreign Application Priority Data

Oct. 4, 1985 [JP] Japan .............................. 60-221665

[51] Int. Cl.[4] .................... H01L 29/46; H01L 29/54; H01L 29/78
[52] U.S. Cl. .................................. 357/23.7; 136/256; 136/258; 357/65; 428/620; 428/432; 428/702
[58] Field of Search .............. 428/446, 432, 689, 697, 428/702, 620; 136/256, 258 AM; 357/30, 23.7, 65

[56] References Cited

U.S. PATENT DOCUMENTS 3,416,044 12/1968 Dreyfus et al. ...................... 357/30
4,040,073 8/1977 Luo ........................................ 357/4
4,278,831 7/1981 Riemer et al. ...................... 136/256

FOREIGN PATENT DOCUMENTS 56-94677 7/1981 Japan ........................... 136/258 AM
57-78135 5/1982 Japan ................................. 136/256

OTHER PUBLICATIONS

J. Michel et al, *Proceedings 2nd E. C. Photovoltaic Solar Energy Conference* (1979), pp. 181-188 (Reidel Pub. Co.).

*Thin Solid Films*, vol. 102, No. 1, Apr. 1983, pp. 1-46, Ohopra et al, "Transparent Conductors-A Status Review".

*IEEE Electron Device Letters*, vol. EDL-4, No. 8, Aug. '83, pp. 269-271, Tsaur et al, "Fully Isolated Lateral Bipolar-MOS Transistors (etc).

*Applied Physics Letters*, vol. 41, No. 6, 9/15/82, pp. 552-554; Luo et al, "Forming Ohmic Contact in CdSe Thin-Film Transistors (etc)".

*Electronics International*, vol. 55, No. 10, 5/19/82, pp. 94,96 Gallagher "Amorphous Silicon Enlarges LCDs".

*Applied Physics Letters*, vol. 42, No. 6, 3/15/83, pp. 538-540, Sulla et al, "Indium Diffusion in Cadmium Selenide Thin-Film Transistors (etc)".

*IEEE Transactions on Electron Devices*, vol. ED-32, No. 9, 9/85, pp. 1757-1760, Schropp et al, "On the Quality of Contacts in a-Si:H Staggered Electrode (etc)".

*Primary Examiner*—Aaron Weisstuch
*Attorney, Agent, or Firm*—Pollock, Vande Sande and Priddy

[57] ABSTRACT

A transparent conductive film formed on a transparent substrate of a thin film transistor or solar cell contains an element falling in Group III or V of the periodic table. The transparent conductive film is formed in contact with a semiconductor layer.

4 Claims, 4 Drawing Figures

SEMICONDUCTOR DEVICES AND LAMINATES INCLUDING PHOSPHORUS DOPED TRANSPARENT CONDUCTIVE FILM

BACKGROUND OF THE INVENTION

The present invention relates to a transparent conductive film which is formed as a transparent electrode in contact with a semiconductor layer in a thin film transistor for use as a switching device of an active liquid crystal display device, or in a solar cell.

For instance, an active liquid crystal display device employs a thin film transistor as a switching device. Conventionally, the thin film transistor has such a structure as depicted in FIG. 1. That is, drain and source electrodes 12 and 13, respectively, each of which is formed by a transparent conductive film of so-called ITO (Indium Tin Oxide) or tin oxide, are disposed apart on a glass or like transparent substrate 11, and a semiconductor layer 14 of amorphous silicon or the like is formed between the drain and source electrodes 12 and 13. In this instance, the drain and source electrodes 12 and 13 are covered with ohmic contact layers 15 and 16 of n+ silicon so as to establish ohmic contact between the electrodes 12 and 13 and the amorphous semiconductor layer 14. The semiconductor layer 14 is covered with a gate insulating film 17 of, for example, silicon nitride, which is, in turn, covered with a gate electrode 18.

Another device which employs a transparent electrode provided in contact with a semiconductor layer is such a solar cell as shown in FIG. 2. In this case, a transparent conductive film 22 is formed on a transparent substrate 21 as of glass, and p-type, i-type, and n-type conductive layers 23, 24, and 25, respectively, of amorphous silicon are formed on the transparent electrode 22 in that order. Furthermore, an electrode 26 of aluminum or similar material is deposited on top of the n-type conductive layer 25.

In the manufacture of the device which has a transparent electrode formed in contact with a semiconductor layer, as described above, the amorphous silicon semiconductor layer 14 in the thin film transistor or the p-type amorphous silicon conductive layer 23 in the solar cell is usually deposited through a plasma assisted CVD (Chemical Vapor Deposition) process. In this case, the substrate 11 or 21 is heated to 200° C. through 300° C. for the formation of the semiconductor layer. The heating of the substrate causes the migration of constituent elements of the transparent conductive films 12 and 13 or 22, for example, indium and/or tin, which enters into the semiconductor layer 14 or p-type conductive layer 23 adversely affecting the fabricated devices.

In the thin film transistor, the ohmic contact layers 15 and 16 are each constituted by, for instance, an n+-type conductive layer, and if indium is diffused into the conductive layer, it will serve as a p-type impurity, making it impossible to obtain good ohmic contact. When indium is diffused into the semiconductor layer 14, it acts as a p-type semiconductor, which impairs the operation characteristics of the thin-film-transistor. Also in the solar cell, the diffusion of indium or tin from the transparent conductive film 22 into the p-type and i-type conductive layers 23 and 24 will cut down the conversion efficiency of the cell.

SUMMARY OF THE INVENTION

It is therefore an object of the present invention to provide a transparent conductive film structure which permits excellent operation of a device of the type having a semiconductor layer and a transparent conductive film formed in contact with each other.

According to the present invention, the transparent conductive film formed in contact with a semiconductor layer contains an element falling in Group V of the periodic table, such as phosphorus, arsenic, antimony, or bismuth, or an element falling in Group III of the periodic table, such as boron, aluminum, or gallium. When the semiconductor layer is formed on such a transparent conductive film, indium or tin in the latter combines with the Group V or III element, preventing it from diffusion into the semiconductor layer. In addition, the Group V or III element forms an ohmic contact layer between the semiconductor layer and the transparent conductive film. Therefore, no particular step is needed for providing the ohmic contact layer.

DESCRIPTION OF THE PREFERRED EMBODIMENTS

Figure 1:
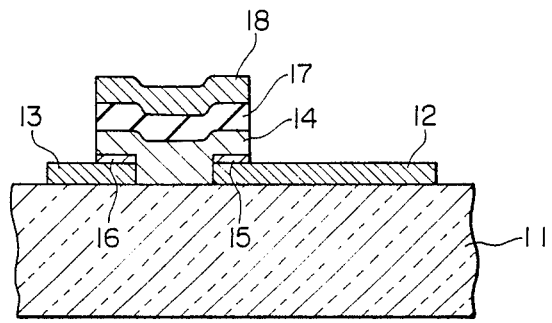
FIG. 1 is a sectional view showing a conventional thin film transistor.
Figure 3:
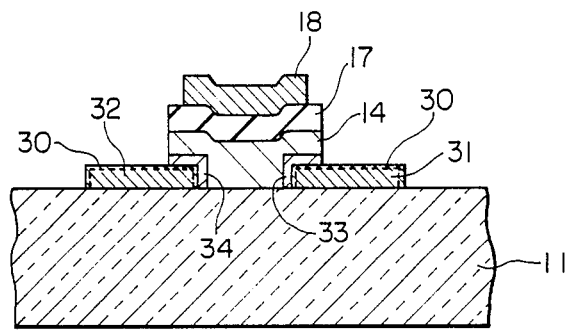
FIG. 3 is a sectional view illustrating a thin film transistor provided with the transparent conductive film according to the present invention.

FIG. 3 illustrates an example of a thin film transistor embodying the present invention, in which the parts corresponding to those in FIG. 1 are identified by the same reference numerals. In this thin film transistor, drain and source electrodes 31 and 32, each of which is formed by a transparent conductive film on the transparent substrate 11, contain phosphorus, for instance. The phosphorus-doped transparent electrodes 31 and 32 can be formed by diffusing phosphorus into, for example, conventional transparent ITO films through an RF plasma assisted CVD process. That is, the substrate 11 bearing an ITO film is heated to 200° C. to 300° C., PH$_3$ gas diluted with argon to 5000 ppm is passed over the ITO film of, for example, 500 Å to 2000 Å thick, at a rate of 10 cc/min in an atmosphere held under a pressure of 10$^2$ Torr, and at the same time, a plasma assisted chemical vapor deposition is caused by an RF power of 20 W for several minutes, thereby forming phosphorus-doped layers 30 in the ITO films.

When the semiconductor layer 14 of amorphous silicon is formed, by the plasma assisted CVD method, on the phosphorus-doped transparent electrodes 31 and 32 thus obtained, indium and tin in the ITO films 31 and 32 are combined with phosphorus in the phosphorus-doped layers 30 and are difficult to migrate, and hence the indium and tin do not diffuse into the semiconductor layer 14.

Furthermore, the phosphorus in the phosphorus-doped layers 30 in the transparent electrodes 31 and 32 partly migrates and diffuses into the semiconductor layer 14 over the entire areas of the contact surfaces of the transparent electrodes 31 and 32 with the semiconductor layer 14, forming ohmic contact layers 33 and 34 at the boundaries therebetween. This eliminates the necessity of involving a particular step of forming such ohmic contact layers in the manufacturing process of the thin film transistor and, in addition, ensures the formation of thin but excellent ohmic contact layers. The gate insulating film 17 and the gate electrode 18 are formed on the semiconductor layer 14 as in the prior art, thus obtaining a thin film transistor.

Figure 4:
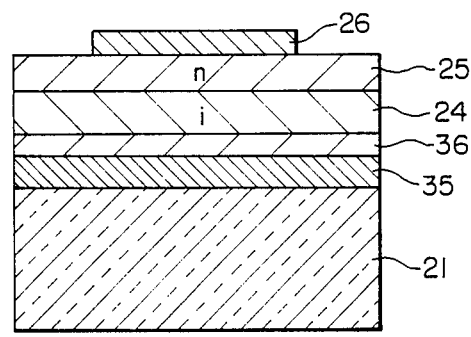
FIG. 4 is a sectional view illustrating a solar cell provided with the transparent conductive film according to the present invention.

FIG. 4 illustrates an example of a solar cell embodying the present invention. A transparent electrode 35 of a conductive film containing boron is formed on the transparent substrate 21 as of glass, after which the i-type and n-type conductive layers 24 and 25 of amorphous silicon are formed on the transparent electrode film 35, and then the electrode 26 is deposited on the n-type conductive layer 25.

In this instance, during deposition of the i-type amorphous silicon conductive layer 24 through, for example, the plasma assisted CVD method, boron in the transparent conductive film 35 migrates and diffuses into the i-type conductive layer 24, thus forming a boron-doped p-type layer 36 in the contact surface between the transparent electrode 35 and the i-type conductive layer 24.

Figure 2:
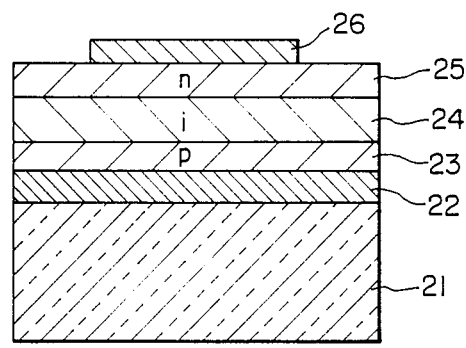
FIG. 2 is a sectional view showing a conventional solar cell.

Accordingly, there is no need of involving a step of forming the p-type conductive layer 23 of the prior art example shown in FIG. 2. In addition, the transparent conductive film 35 contains boron, and indium and tin in the film 35 are combined with the boron and hence are prevented from migration. In other words, the indium and tin in the transparent conductive film 35 are prevented from diffusion into the i-type conductive layer 24; so that a solar cell of a high conversion efficiency can be obtained.

The method for forming the phosphorus-doped ITO film, for instance, is not limited specifically to the process utilizing the RF plasma assisted CVD technique, as referred to previously. The phosphorus can be thermally diffused into a phosphorus-free transparent conductive film by its heat treatment in an atmosphere containing, for example, the PH$_3$ gas. In this instance, the source of diffusion may be a liquid such as phosphorus oxychloride or a solid such as phosphorus pentoxide as well as the gas. It is also possible to form the transparent electrodes 31 and 32 or 35 through sputtering of phosphorus-doped indium tin oxide or tin oxide, or through vacuum evaporation of the phosphorus-containing tin oxide or indium oxide. Also it is possible to obtain the phosphorus-doped indium oxide or tin oxide conductive film by sputtering indium and/or tin in an atmosphere containing the PH$_3$ gas, oxygen, and argon. Moreover, phosphorus-doped ITO can also be obtained by spraying, for example, phosphorus chloride together with indium chloride and tin chloride. The ITO can also be formed through the plasma assisted CVD method using an atmosphere containing phosphorus oxychloride, oxygen, and argon. Furthermore, the phosphorus-doped transparent conductive film can be formed through an ion implantation technique such that ionized phosphorus produced from an ion source of PH$_3$ gas is accelerated by 30 to 100 KV and implanted into the transparent conductive film.

It has been ascertained experimentally that the phosphorus-doped transparent conductive film thus obtained has substantially the same sheet resistance and light transmissivity as does a phosphorus-free transparent conductive film. A boron-doped transparent conductive film can be formed in various manners such as mentioned above.

As described above, according to the present invention, it is possible to obtain a thin film transistor of excellent characteristics in which good ohmic contact is established between the source and drain transparent electrodes and a semiconductor layer, allowing excellent operation characteristics. Moreover, the use of the transparent conductive film of the present invention provides a solar cell of a high conversion efficiency. In either case, a good ohmic contact layer can be obtained without the necessity of involving any particular manufacturing step therefor.

It will be apparent that many modifications and variations may be effected without departing from the scope of the novel concepts of the present invention.

What is claimed is:

1. A laminate of a transparent conductive film and a semiconductor layer, said transparent conductive film being an ITO film containing phosphorus and being formed on an insulating substrate, said semiconductor layer being formed on said ITO film through a plasma assisted chemical vapor deposition process, at least the surface area of said semiconductor layer in contact with said ITO film containing phosphorus to form an ohmic contact layer.

2. The laminate of a transparent conductive film and a semiconductor layer according to claim 1 wherein the phosphorus is contained in the surface of said ITO film in the form of a phosphorus-doped layer.

3. The laminate of a transparent conductive film and a semiconductor layer according to claim 1 wherein said ITO film contains the phosphorus substantially throughout its thickness.

4. A thin film transistor comprising source and drain electrodes of an ITO film containing phosphorus and formed on an insulating substrate, a semiconductor layer partly in contact with said source and drain electrodes and forming an active region of said thin film transistor, said semiconductor layer being formed through a plasma assisted chemical vapor deposition process, surface areas of said semiconductor layer in contact with said ITO film containing phosphorus to form an ohmic layer.

* * * * *